(12) United States Patent
Garvin et al.

(10) Patent No.: US 7,538,562 B2
(45) Date of Patent: May 26, 2009

(54) HIGH PERFORMANCE MINIATURE RF SENSOR FOR USE IN MICROELECTRONICS PLASMA PROCESSING TOOLS

(75) Inventors: Craig Garvin, Cambridge, MA (US);
Michael Bonner, Gardiner, NY (US);
Kenneth Rosys, Liverpool, NY (US)

(73) Assignee: Inficon, Inc., East Syracuse, NY (US)

( * ) Notice: Subject to any disclaimer, the term of this patent is extended or adjusted under 35 U.S.C. 154(b) by 0 days.

(21) Appl. No.: 11/725,275

(22) Filed: Mar. 19, 2007

(65) Prior Publication Data

US 2007/0222428 A1 Sep. 27, 2007

Related U.S. Application Data

(60) Provisional application No. 60/783,894, filed on Mar. 20, 2006.

(51) Int. Cl.
*G01R 27/26* (2006.01)
(52) U.S. Cl. .................. 324/687; 315/111.21; 313/495; 361/760

(58) Field of Classification Search .................. 324/687; 438/9, 17; 315/111.21
See application file for complete search history.

(56) References Cited

U.S. PATENT DOCUMENTS

| 5,175,472 | A | * | 12/1992 | Johnson et al. | ........ 315/111.21 |
| 5,770,922 | A | * | 6/1998 | Gerrish et al. | ......... 315/111.21 |
| 6,317,106 | B1 | | 11/2001 | Beeteson et al. | |
| 6,501,285 | B1 | * | 12/2002 | Hopkins et al. | ............. 324/687 |
| 6,635,985 | B2 | * | 10/2003 | Beeteson et al. | ............ 313/495 |
| 2002/0123263 | A1 | | 9/2002 | Lazaro et al. | |
| 2003/0160567 | A1 | * | 8/2003 | Coumou | ................. 315/111.21 |
| 2004/0121650 | A1 | * | 6/2004 | Lazaro | ....................... 439/598 |
| 2005/0243527 | A1 | * | 11/2005 | Jandzio et al. | .............. 361/760 |
| 2006/0011591 | A1 | * | 1/2006 | Sellers | .................. 219/121.54 |

* cited by examiner

*Primary Examiner*—Timothy J Dole
*Assistant Examiner*—Benjamin M Baldridge
(74) *Attorney, Agent, or Firm*—Hiscock & Barclay, LLP

(57) ABSTRACT

A high-performance miniature RF sensor that maintains gain, directivity, and isolation in a miniature package. The miniature RF sensor includes stacked current and voltage pickups disposed in a PCB construction, the sensor further including quarter wave transforming filter, triaxial shielding, and skin-effect filtering.

21 Claims, 10 Drawing Sheets

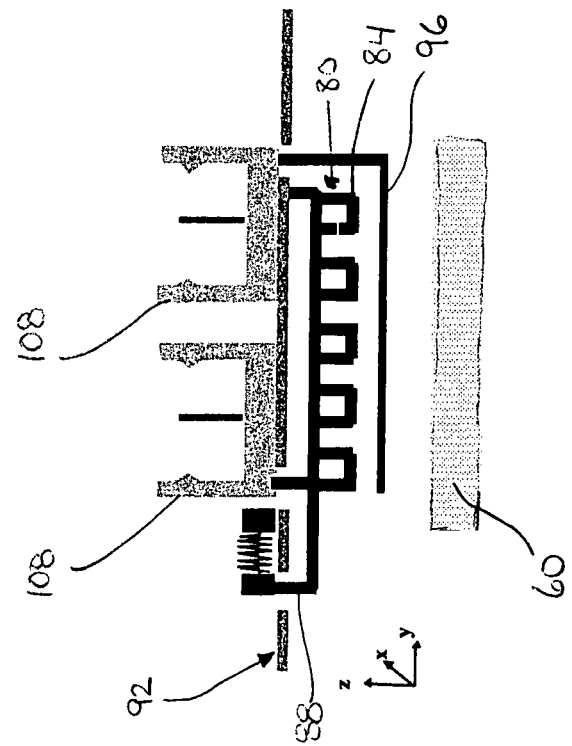
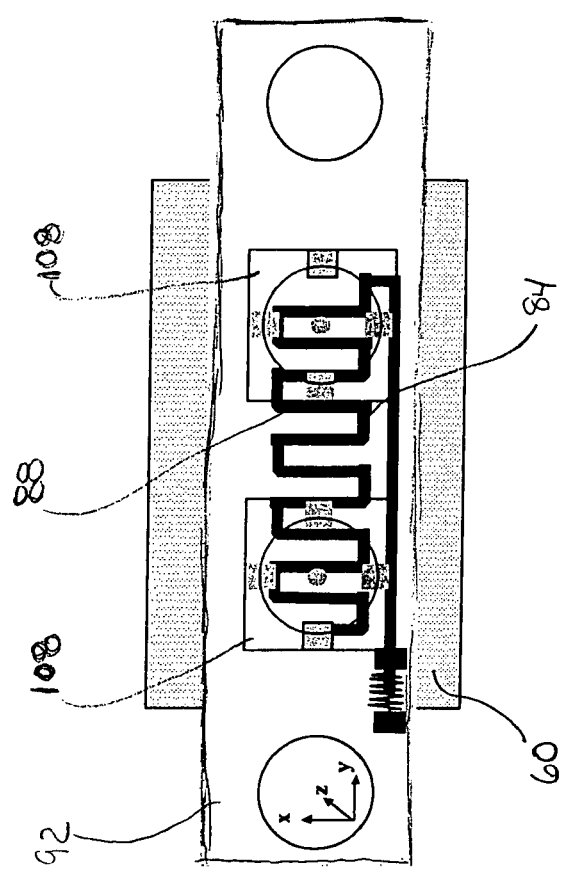
Fig. 5(a)
Fig. 5(b)

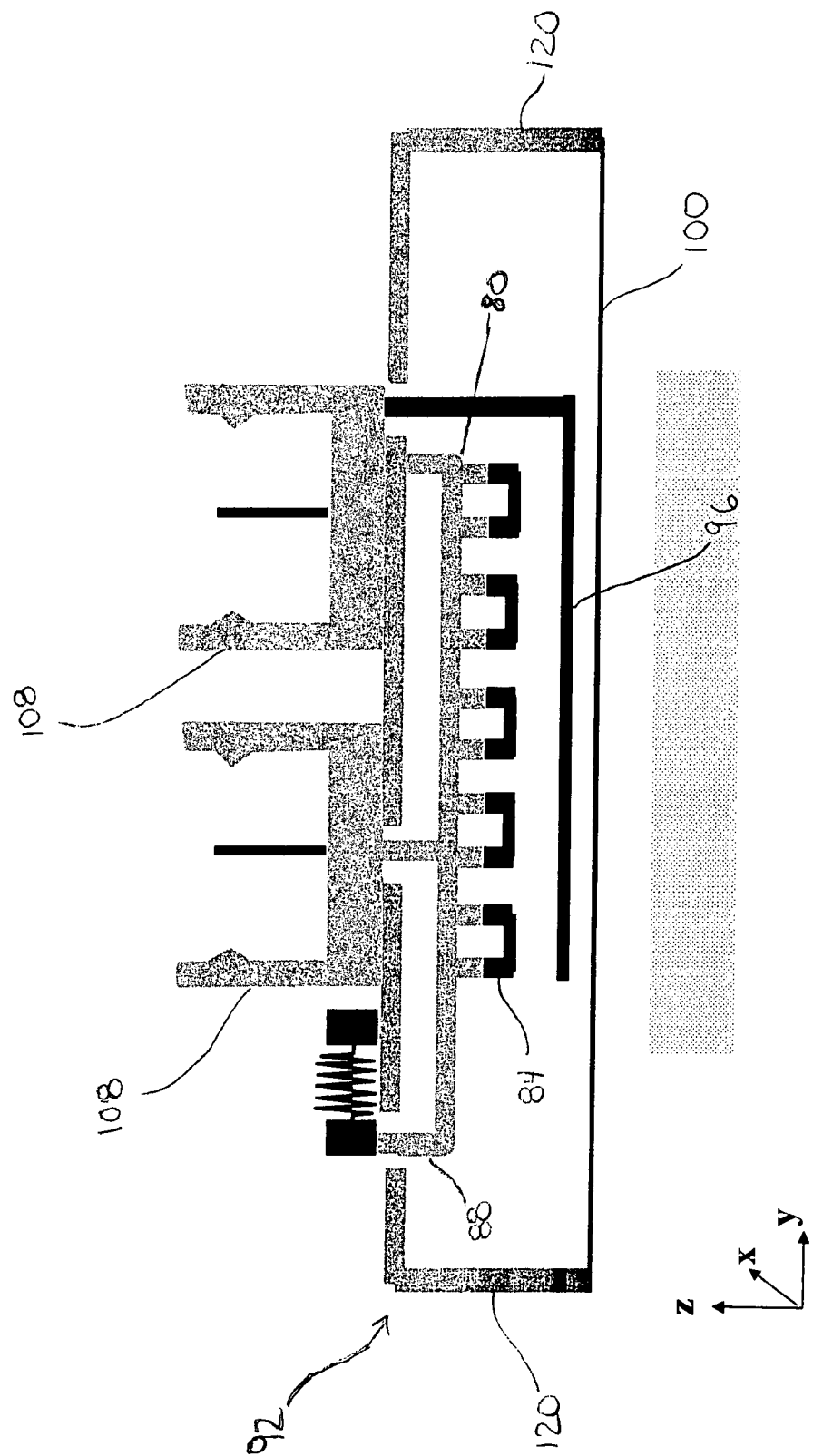

HIGH PERFORMANCE MINIATURE RF SENSOR FOR USE IN MICROELECTRONICS PLASMA PROCESSING TOOLS

CROSS REFERENCE TO RELATED APPLICATIONS

Reference is made to and priority claimed from U.S. Provisional Application Ser. No. 60/783,894, filed Mar. 20, 2006, under 35 U.S.C. §119(e).

BACKGROUND AND SUMMARY OF THE INVENTION

The value of an RF sensor; that is, a device that measures the RF current and voltage supplied to the plasma processing chamber of a microelectronics processing tool by a high power RF supply, is well established. Numerous patents, such as, for example, U.S. Pat. No. 6,501,285, have been granted for design and application of both the sensor and associated signal processing electronics. However, each of these inventions has focused on maximizing the electromagnetic performance of such systems. The fact that nearly all RF sensor applications involve retrofitting of the sensor to an existing process chamber that was not originally designed to accommodate the device has largely been overlooked. As a result of this performance focus, existing RF sensors are too large to fit in most applications without extensive and undesirable modifications to the processing tool and/or the RF sensor.

A typical RF sensor 10, as depicted in FIG. 1, comprises a short piece of coaxial transmission line, shielded pickups, and passive or active filtering circuitry. The RF sensor 10 itself forms the coaxial transmission line in the following manner. First, the sensor case or box 14 forms the outer conductor and shielding for the pickups. A constant diameter solid rod made from silver plated copper or other similar material forms a center conductor 18. Dielectric material 22 consisting of silicon, quartz, silicon carbide and/or alumina, among other materials, are used to maintain a predetermined geometric relationship between the center conductor 18 and the ground plane. A capacitive voltage pickup 26 and an inductive current pickup 30 are placed within the dielectric material 22. A bulkhead connection 34 feeds the leads from these pickups 26, 30 through the outer conductor to corresponding filter circuits 38, along with possible additional signal processing circuitry. The modified signals are then sent to an additional unit (not shown) for digitization.

The above configuration of a typical RF sensor has significant performance advantages. First and by forming a length of transmission line as shown in FIG. 1, the RF sensor assures that the pickups are exposed to a uniform electromagnetic field, regardless of the surrounding geometry. As a result, pickups have a constant gain as a function of current and voltage, independent of their application. Second and by forming a shielded enclosure, the RF sensor assures that the pickups are only sensitive to fields due to current on the center conductor and potential difference between the center and outer conductor, and not sensitive to extraneous fields. Finally, the sensor configuration easily accommodates standard RF connectors, and thus allows calibration on a test stand. Because of the sensor's design, this calibration is maintained independent of application.

Standard inductive current pickups and capacitive voltage pickups have increasing gain with increasing RF frequency, as illustrated graphically in plot 42 depicted in FIG. 2. This illustrated feature has the drawback of increasing the dynamic range of signal magnitude that must be accurately digitized by the RF sensor electronics. The simplest known way to correct for the increasing gain is to incorporate active or passive filtering in the sensor, as shown in FIG. 1, thereby resulting in a flatter response with frequency, as depicted according to plot 46, FIG. 2. Incorporating filtering in the sensor avoids the complication of a length of transmission line between the pickups and the filters. Due to transmission line effects, the total gain of the circuit can vary in unexpected ways with frequency.

The filtering circuit can also be used to maximize the signal from the pickups, allowing their size to be minimized. Minimum size is essential for minimizing stray impedances that result in crosstalk. More specifically, any inductance in the capacitive pickup results in current level impacting the voltage signal, and any capacitance on the inductive pickup results in voltage level impacting the current signal.

Finally, incorporating signal processing, as is done in typical RF sensor, has further performance advantages. The voltages generated by the pickups are orders of magnitude lower than the levels that are found in the plasma tool. Signal processing in the sensor, such as mixing to an intermediate frequency (IF) or even complete digitization greatly reduces the risk of the signal from the pickups being corrupted before they are quantified.

A standard RF sensor is very easily mated to a standard transmission line using standard RF connectors. However, this option is rarely, if ever, available. Rather, the RF sensor must be retrofitted to the existing RF power path in the plasma processing tool. This path typically consists of a center conductor of varying dimensions, an air dielectric, and a poorly defined ground plane. Installation of an RF sensor in these conditions requires modification to the existing power path. In addition to requiring significant effort and application-specific parts, these modifications can result in unacceptable changes to the electromagnetic characteristics of the power path.

Yet a further difficulty results from the physical size of the sensor device; wherein such devices are usually defined by a cubic box-like configuration in which each side of the configuration is several inches in length and width. In many cases, space for installation is simply not available. This results in one of two undesirable solutions. First, extensive modifications, such as in the form of spacers, additional conductors and custom fittings are required. Installation of these extensive modifications is costly and time-consuming and may also alter tool performance. Alternatively, and rather than mounting the RF sensor in proximity to the plasma chamber where it can most effectively monitor the process, the sensor is placed in a roomier, but more remote location, where its performance is impaired.

In conclusion, typical RF sensors have compromised usability for performance. The standard design is readily calibrated and assures that readings on a process chamber are the same as those obtained on a test stand. This performance is achieved at the cost of significant modification of the electrical or power path of the process chamber. This modification is costly and time consuming, and can significantly compromise the electromagnetic characteristics of the tool and impact processing performance.

Achieving a low-performance miniature RF sensor is relatively straightforward. As long as a capacitor and inductor are placed in proximity to the center conductor, signals that are roughly proportional to voltage and current will be generated. The challenge, however, is in maintaining high performance in a miniature RF sensor. In order to obtain high performance, practitioners of the art must successfully maintain gain, directivity, and isolation within a miniature sensor package. To date, Applicant is not aware of a miniature RF sensor package that accomplishes these objectives.

Therefore and according to a first aspect, there is provided a miniature RF sensor for measuring the RF current and voltage supplied to a plasma processing chamber of a microelectronics processing tool by a high power RF power supply, the assembly comprising a sensor head and including a conductor that is formed as one side of a box-like structure forming a housing, said structure including a current pickup and a voltage pickup, each of said pickups being stacked in relation to one another and said conductor.

In one version, the current and voltage pickups are provided in a printed circuit board construction, wherein the voltage pickup is formed from a grid or mesh element disposed in spaced relation relative to said conductor, in which said conductor can be a strap conductor of a plasma tool. The PCB construction, quarter wave transforming filter, stacked pickups, triaxial shielding, and skin-effect filtering, each feature resulting in a high performance miniature RF sensor. The proposed design meets both retrofitting and electromagnetic performance goals.

BRIEF DESCRIPTION OF THE DRAWINGS

For a further understanding of these and objects of the herein-described application, reference will be made to the following Detailed Description which is to be read in connection with the accompanying drawings, in which:

FIGS. 5(a) and 5(b) depict top and mid-plane section views, respectively, of an in-board inductor for the RF sensor in accordance with an embodiment;

FIG. 7 depicts a mid-plane view of the RF sensor, including a skin effect shield and a top shield;

DETAILED DESCRIPTION

Figure 1:
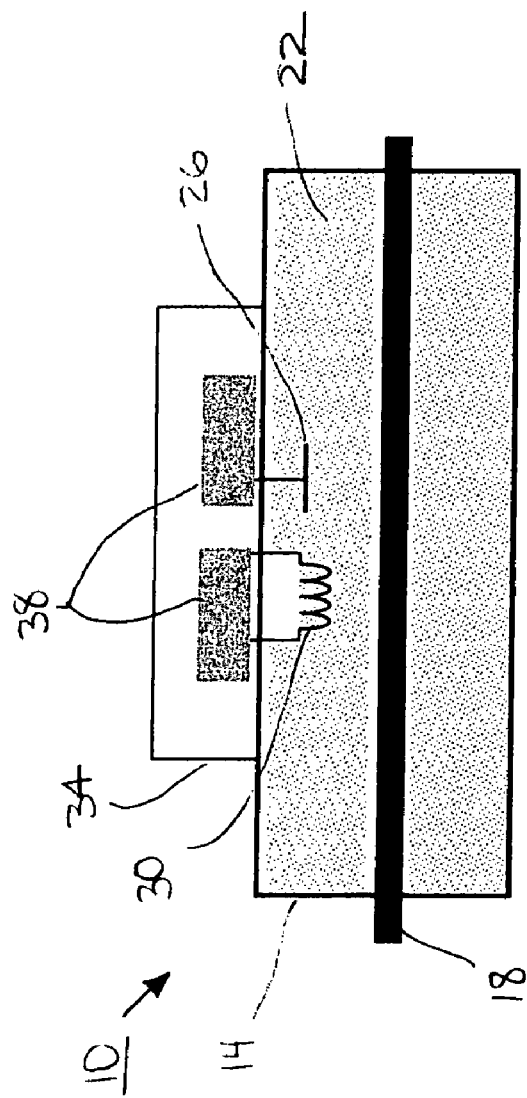
FIG. 1 depicts a prior art RF sensor.

A number of features are described herein with regard to an improved miniature RF sensor assembly. The resulting design is a high performance miniature RF sensor that meets both retrofitting and electromagnetic performance goals.

A number of goals/requirements for the herein defined RF sensor are first stated herein for purposes of clarity:

1. Constant gain independent of application

The voltage and current gain of the RF sensor is defined as the output level of each transducer as a function of actual voltage and current levels at the point of measurement. A key requirement for a useable RF sensor is that the gain of the sensor be the same, independent of the sensor's application and specifically that the gain be insensitive to variations in RF electrical path geometry. In this way, calibration values that are obtained on a test stand can be used to convert sensor output to engineering units, independent of application.

2. Constant gain independent of RF frequency

Plasma processing tools employ RF power supplies that operate over frequencies ranging from several hundred kilohertz to nearly 100 MHz. Standard pickups use Faraday coupling between an inductive current pickup and a capacitive voltage pickup. The resulting gain of these sensors is directly proportional to frequency as previously discussed with regard to FIG. 2. Uncorrected, this effect results in immeasurably weak signals at low frequency and destructively strong signals at high frequency, as shown in plot 46.

3. High Directivity

Directivity refers to the directed flow of signals, specifically of high power RF voltage to the voltage pickup and high power RF current to the current pickup. As previously noted above, no structure is purely inductive or capacitive. As a result, some of the signal on the voltage pickup will be due to the actual current level, and some of the signal on the current pickup will be due to voltage. High directivity means that this cross talk is minimized.

4. High Isolation

Isolation refers to the separation between signal paths. In an RF sensor application, isolation refers to the insensitivity of the RF pickups to fields other than those to be measured. The RF electrical path in a plasma processing chamber can often be complex, with the conductor sometimes doubling back on itself. In such cases, it is critical for the pickups to only be sensitive to electrical conditions of the RF electrical path at the point of measurement and insensitive, or isolated from, the electrical conditions at any other point.

5. Minimum Loading

Loading describes the impact, either in terms of power absorbed or impedance change, of a circuit on the electrical network that includes it. In the case of an RF sensor, loading refers to the change in the RF electrical path that results from adding a sensor. Plasma processing tools are precisely calibrated to yield a desired outcome as a function of settings, such as generator power and process time. If an RF sensor 'loads' the RF electrical path, then the same settings do not result in the same plasma conditions and the process outcome changes. Clearly, the loading effect of the RF sensor must be minimized.

Figure 3B:
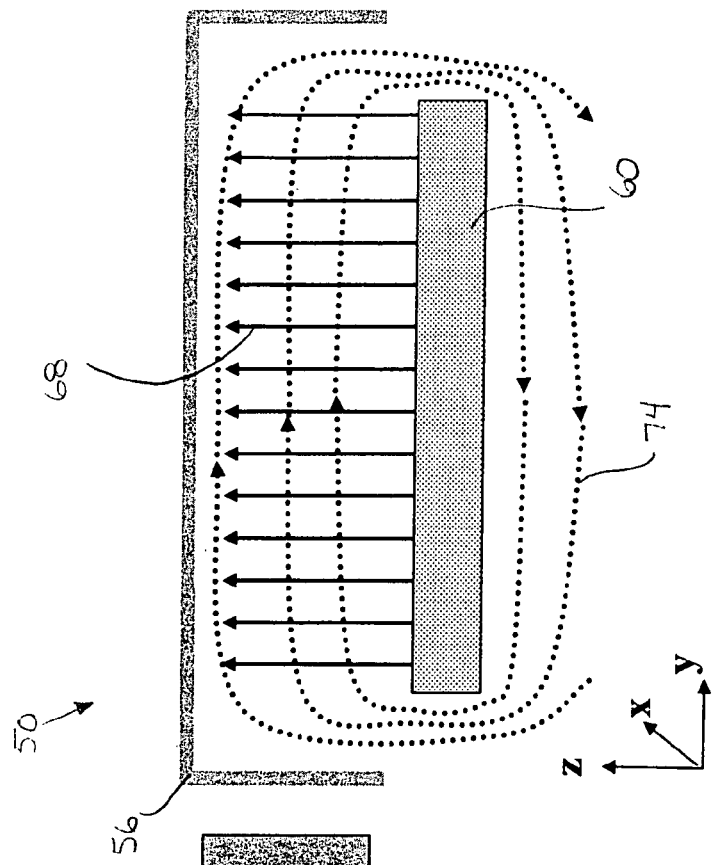
FIGS. 3(a) and 3(b) depict top and mid-plane section views, respectively, of a five-sided box construction of a miniature RF sensor according to an embodiment.
Figure 3A:
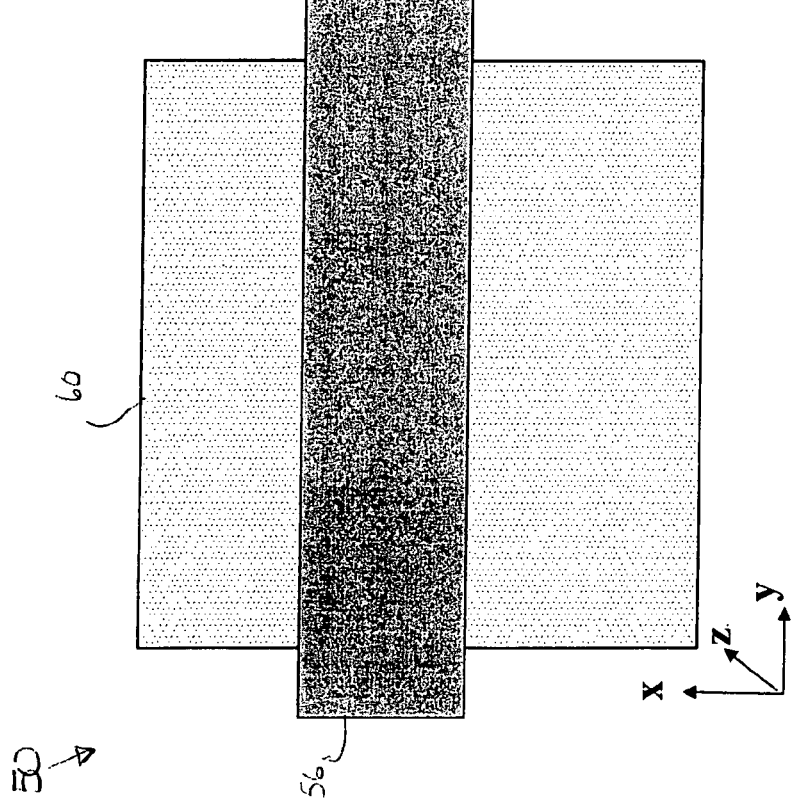

Referring to FIGS. 3(a) and 3(b), there is shown a miniature RF sensor assembly 50 made in accordance with an embodiment of the present invention. Typically, the vast majority of plasma processing tools use a flat planar RF strap power conductor. Typically, this strap power conductor has a width dimension of about 0.6" or 0.75". As previously noted, most existing RF sensor designs utilize a cubic housing. The herein described assembly 50, shown in FIG. 3(a) and (b), provides a five-sided sensor enclosure 56 that further utilizes the existing flat power conductor strap 60 of the plasma processing tool as the $6^{th}$ wall of the enclosure, thereby creating a constant electromagnetic environment that is independent of application. According to this embodiment, the five-sided enclosure 56 is wider than the RF conductor 60 in the y-direction, as shown in FIGS. 3(a) and 4(a). The result is an approximation of a Microstrip transmission line in the following manner described below. The five-sided enclosure 56 acts as a ground plane with sidewalls with the strap acting herein as the RF conductor. The herein described design has been analyzed and shown to have constant electric and magnetic field strength between the conductor and the ground plane. More importantly, field strength is constant independent of strap width, as shown in FIG. 3(b), the electric field being depicted by lines 68 and the magnetic flux lines being depicted by lines 74. Effectively, the foregoing design creates a section of transmission line with constant EM properties, without the size or modification requirements of a coaxial transmission line.

Figure 4B:
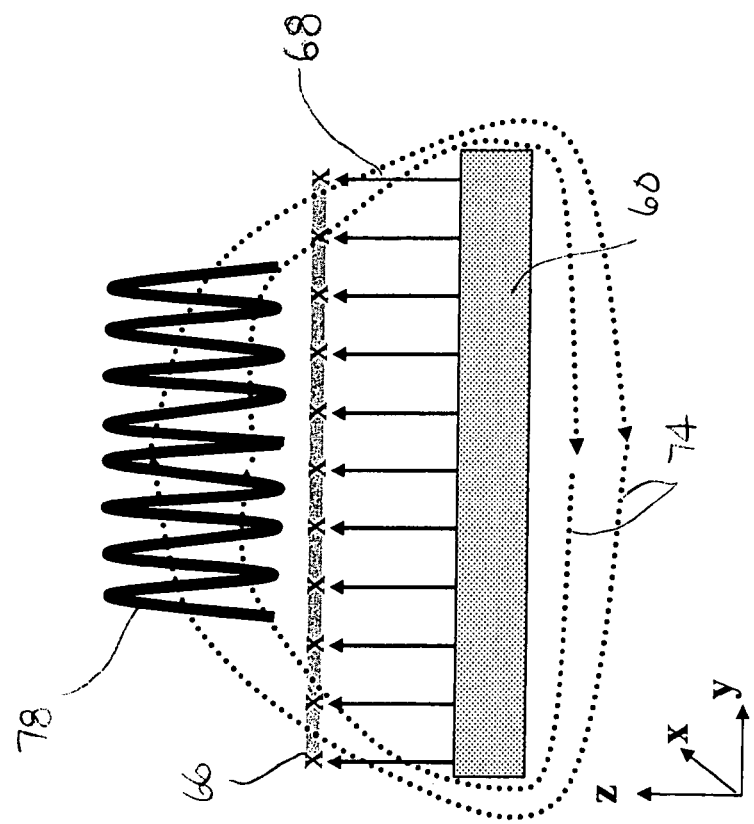
FIGS. 4(a) and 4(b) depict top and front views, respectively, of an oriented electric field shield and voltage pick-up.
Figure 4A:
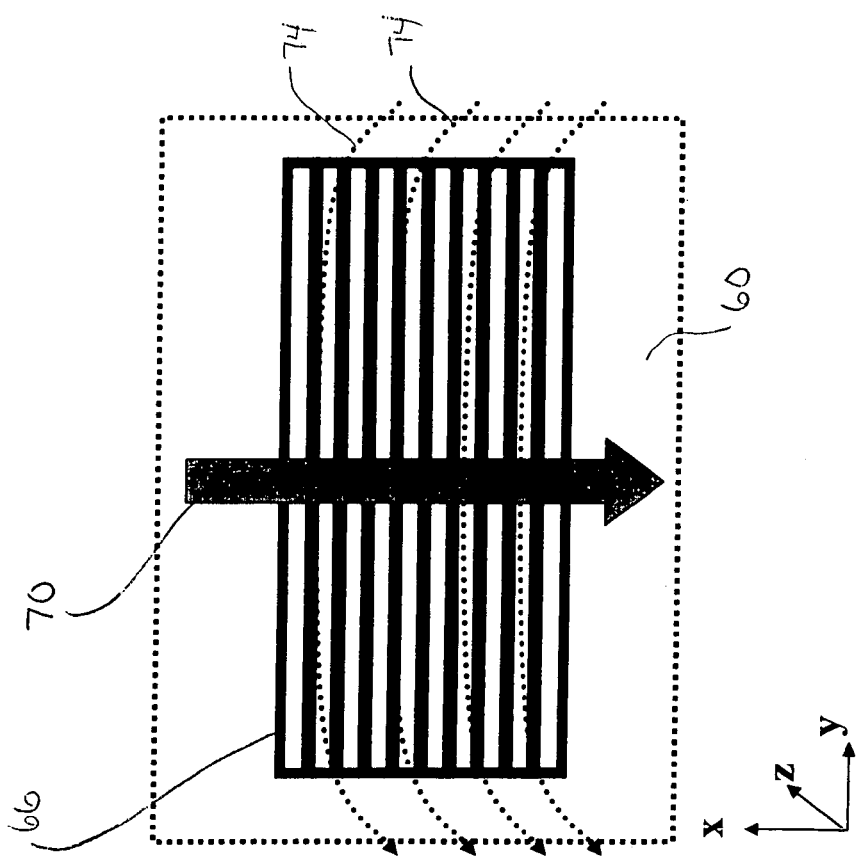

Referring to FIGS. 4(*a*) and 4(*b*), a key space saving is achieved in the herein described RF sensor design by stacking each of the voltage and current pickups in relation to the RF conductor 60. Moreover and by making the voltage pickup 66 from a grid or line element, the entire EM field of the RF conductor 60 is not captured by the voltage pickup, as is shown by the magnetic flux lines 74 represented in the partial front view of FIG. 4(*b*). A current pickup 78, FIG. 4(*b*), can then be placed or positioned on top of the voltage pickup 66 and still capture the magnetic field 74. By making the current pickup 78 from a loosely spaced coil, the entire EM field is also not captured by the current pickup. The current pickup 78 can therefore be placed also be placed below the voltage pickup 66 wherein the latter can still capture the electric field.

More particularly, a horizontal screen configuration is herein described for the capacitive (voltage) pickup 66, as illustrated in FIGS. 4(*a*) and 4(*b*), the latter permitting both directivity and miniaturization to be achieved by means of an oriented voltage pickup. According to this design, the voltage pickup, which is formed from a mesh or other element made from copper or other non-magnetic conductor, is oriented in a direction that is parallel to the lines of magnetic flux 74 wherein the direction of current flow 70 is shown along the x-direction. As such, the capacitive pickup 66 is effectively transparent to magnetic flux. However, the pickup 66 further acts as a shield with regard to the electric field, as shown in FIG. 4(*b*). Therefore a single element performs two functions; that is acting as a voltage pickup and acting as a shield to block electric fields from the inductive pickup. As noted, the current pickup 78 in the form of a loose coil is stacked above the voltage pickup, as shown in FIG. 4(*b*), thereby providing space saving and also improving directivity in that less electric field is transmitted to the inductor, its effective stray capacitance being reduced, with improved directivity of the sensor being a derived benefit.

Though stacking of the voltage and current pickups can be accomplished in a variety of ways for purposes of creating a high performance miniature RF sensor assembly, one preferred technique is to manufacture the entire transducer assembly onto a printed circuit board (PCB).

To that end, a printed circuit board design is herein described. Referring first to FIGS. 5(*a*) and 5(*b*), an inductive (current) pickup 80 can be formed by way of a printed circuit board construction by using two internal metal layers 84, 88 of a printed circuit board 92 that are joined to one another by blind vias. As in the preceding, the current pickup 80 is disposed above a metal layer that is used to define a capacitive (voltage) pickup 96, the latter layer forming a grid in the x-direction as shown herein. Each of the above layers is disposed in parallel relation above the conductor 60. This inductor design has the advantage of making maximum use of the available space to maximize current gain, as well as allowing standard RF connectors 108 to be mounted close to the centerline of the board 92, as described below in greater detail. Alternatively and in lieu of a capacitive pickup layer, the board 92 can include an in-board capacitive pickup and an electric field screen, as described previously.

Figure 6B:
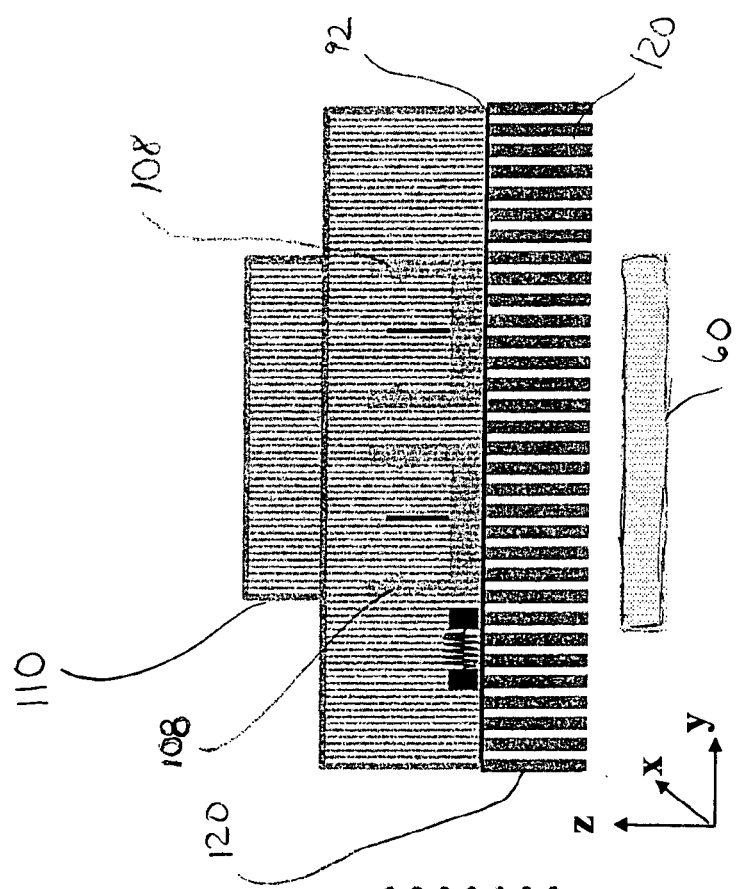
FIGS. 6(a) and 6(b) depict top and side views, respectively, of the five-sided box of FIG. 3 to the PCB assembly, partially shown in FIG. 5.
Figure 6A:
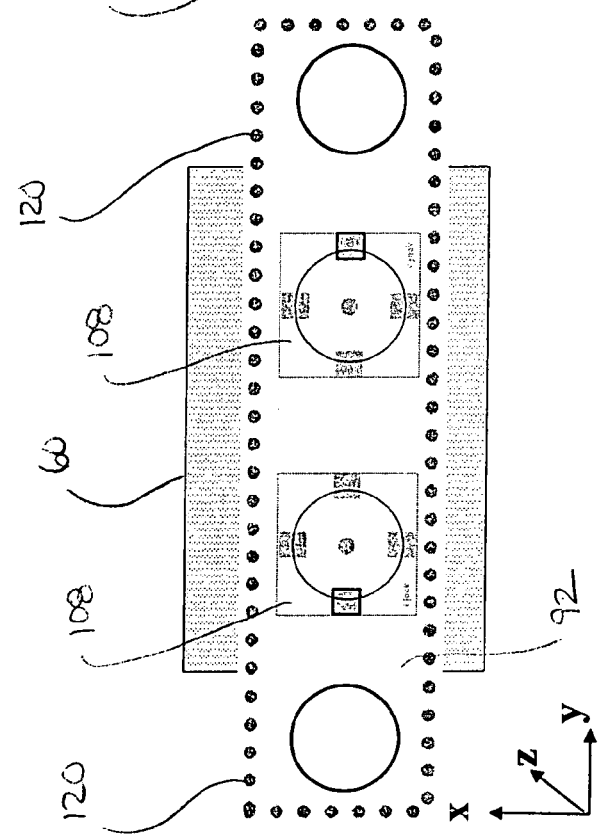

Referring briefly to FIGS. 3(*a*) and 3(*b*), the five-sided sensor enclosure 56 that is shown provides additional structural purposes. First and according to this embodiment, the top of the box 56 can incorporate a strain relief and shield structure 110 for attaching a triaxial cable 140, described subsequently, as shown in FIGS. 6(*b*) and 9. A further structural requirement involves attaching the five-sided enclosure 56 to the PCB assembly 92. Both shielding and structural goals can be met by a plurality of vias 120 that are disposed around the outer periphery of the circuit board 92. As illustrated in FIGS. 6(*a*) and 6(*b*), the plurality of vias 120 act as pads for soldering the strain relief & shield structure 110, as well as extending the shielding around each of the sides of the circuit board 92.

The depth that electromagnetic fields penetrate a conductor is a function of both conductivity and frequency. This effect can be exploited as illustrated in FIG. 7, by the implementation of a skin effect shield 100. In this embodiment, the skin effect shield 100 consists of an additional extremely thin metal layer of the printed circuit board 92 that is disposed closest to the conductor 60 (i.e., beneath the capacitive pickup 96) and is grounded to the plurality of shielding vias 120. This shield 100 serves to act as a low pass filter, in order to flatten transducer response with frequency. More particularly and at low frequencies, the metal layer is much thinner than the skin depth, and as a result creates almost no attenuation of the electromagnetic field, and no attenuation of either voltage or current pickup gain. As frequencies increase, the metal layer becomes on the order of, then thicker than the skin depth, resulting in increasing attenuation with frequency. The end result is that a properly chosen bottom layer results in an effective and very compact filter to effectively flatten transducer response versus frequency. FIG. 7 further clearly illustrates the board construction most clearly wherein the bottommost layer of the PCB forms the skin effect shield 100, the capacitive pickup 96 being disposed immediately above the skin effect shield layer 100 followed by each of the two layers 84, 88 forming the in-board inductive pickup 80 wherein the shielding vias 120 surround the periphery of the circuit board 92. The top most layer of the PCB 92 further includes a pair of standard RF connectors 108 that are attached thereto by conventional means, each connected by terminals to the inductive and voltage pickups 80, 96.

Figures 8A, 8B:
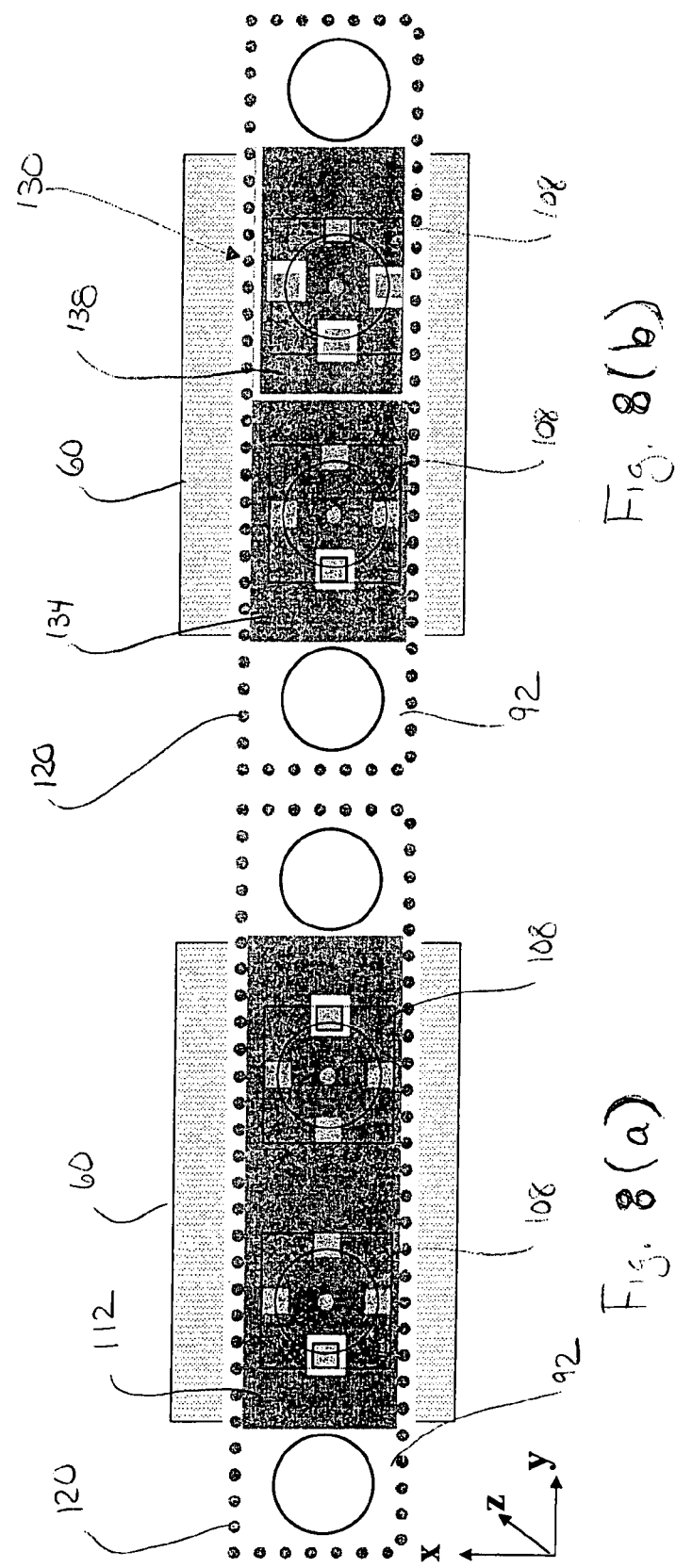
FIGS. 8(a) and 8(b) depict alternative embodiments for a single top shield and a balanced top shield, respectively.

As previously noted, the herein described sensor assembly 50 forms a sensor head that is connected to cabling via the standard RF connectors 108. Both the connectors 108 and cabling can act as pickups and therefore compromise the directivity of the sensor assembly 50. According to this embodiment, a single top shield 112 is illustrated in FIG. 8(*a*), this shield being provided herein to combat the above-noted effect. According to this embodiment, a metal flood is used on the entire top layer of the circuit board 92, with the exception of the positive terminals of the RF connectors 108. This metal layer is grounded and thereby blocks any fields from coupling to either the connectors or cables that are disposed above the top shield layer. This layer 112 is further used as the solder point for the strain relief and shield structure 110, FIG. 9.

An alternative embodiment to this design is depicted in FIG. 8(*b*) and relates to a balanced top shield 130. The use of additional grounded shielding greatly improves isolation and directivity at the cost of loading the RF electrical path. By using a grounded shield, the sensor head has more impedance, and therefore acts as more of a load to the RF electrical path. The balanced top shield 130 maximizes isolation while minimizing the loading effect. In this latter alternative approach, a 5-sided enclosure is not used, because the sensor head is not externally grounded. Rather, the top of the circuit board 92 is covered by two separate metallizations 134, 138 of substantially equal area. One of the metallizations 134 is connected to the positive terminal of the voltage pickup 66, with the other metallization 138 being grounded and connected to the shielding vias 120. In this configuration, external electric fields will charge each of the metallizations 134, 138 equally. Since voltage results from charge differences, this shielding will have no effect on the capacitive pickup, and thus the voltage gain will be independent of electric fields outside of the RF path, the definition of isolation. This approach will result in less of a load on the RF electrical path than the use of a grounded shield. Since the balanced shield is allowed to build up charge, it does not act as a capacitor relative to the RF electrical path.

Figure 9:
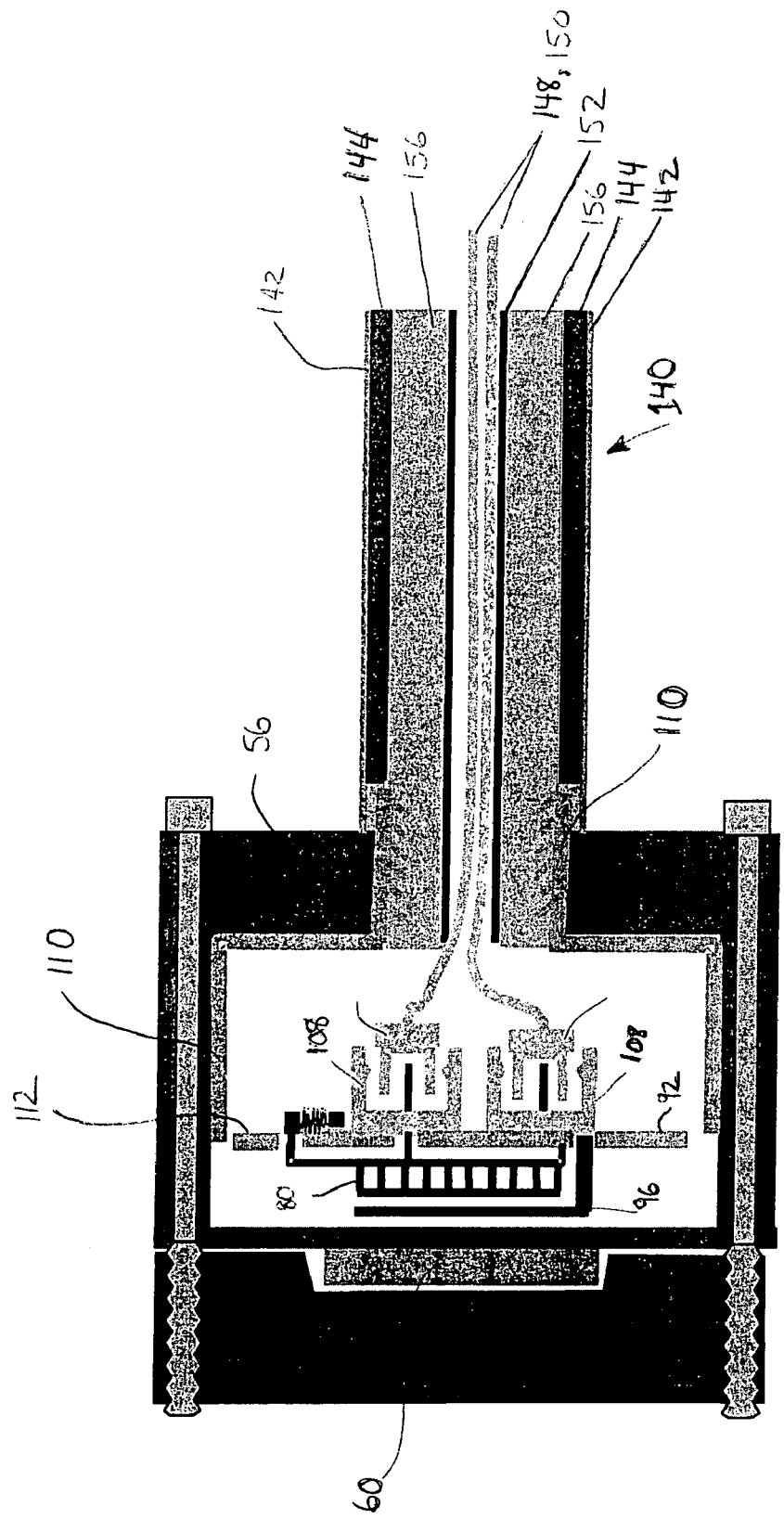
FIG. 9 depicts a triaxial cable configuration for use with the miniature RF sensor.

Referring to FIG. 9, the five-sided enclosure 56 is shown in relation to the conductor strap 60 and the strain relief and shield structure 110 wherein the top of the enclosure includes an opening 57 that permits the strain relief and shield structure to be mounted to the shielding vias 120 of the circuit board 92. It is known that once coaxial cables extend beyond a significant electrical length, they also can act as pickups in the presence of an electric field and influence directivity. Therefore, a triaxial cable 140, also illustrated in FIG. 9, eliminates this problem while also meeting environmental requirements.

Still referring to FIG. 9, the triaxial cable 140 according to this embodiment includes a structural outer coaxial ground shield that includes an outer jacket 142 covering an outer braid 144. A dielectric layer 156 is provided herein between a coaxial conductor 152 and the outer braid 144 wherein the triaxial cable encases a pair of coaxial cables 148, 150 and not merely a single cable as in the case of typical cables of this type, each of the coaxial cables being disposed within the center of the cable surrounded by the coaxial conductor 152. In this design, the typical arrangement of the coaxial conductor 152 and the dielectric material layer 156 is reversed. That is to say, in a typical triax cable, a dielectric layer is present between an inner coaxial conductor and an outer coaxial conductor. Because the present RF sensor is installed in a high voltage environment, the sensor must be isolated by enough material to prevent shorting to any high voltage surfaces. To meet this goal, the dielectric layer 156 is disposed on the outside of the outer coaxial conductor as shown.

Figure 2:
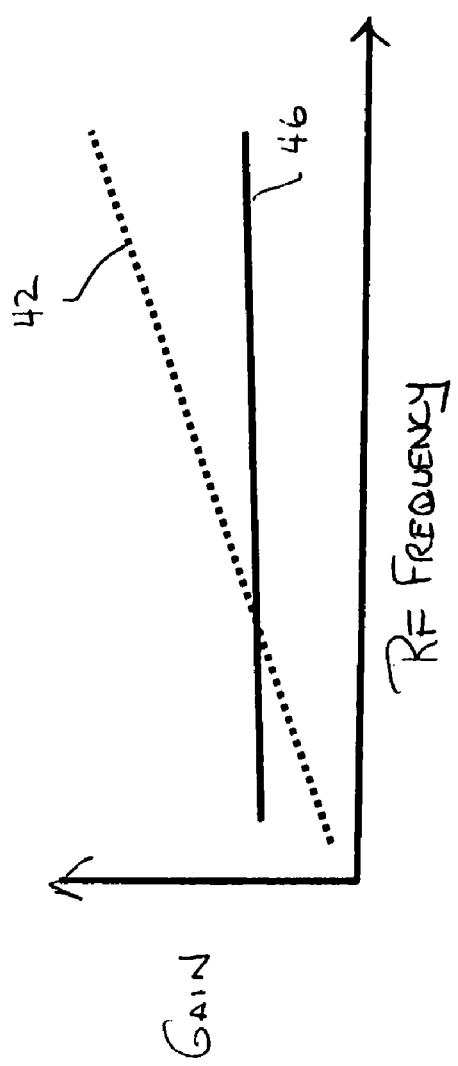
FIG. 2 is a known graphical depiction of pick-up gain variation versus increasing RF frequency including filtering effects.

Moreover, the goal of flattening pickup gain response vs. frequency as shown in FIG. 2 can be achieved with minimal circuitry in the sensor head by exploiting transmission line effects.

To flatten pickup gain response, a varying impedance termination is needed. If the capacitive pickup 96 is terminated with a high impedance at low frequency, and a low impedance at high frequency, then the result will be a constant voltage drop across the termination impedance, and, roughly speaking, a constant gain. For the inductive pickup 80, a current divider is needed in order to send the maximum current at low frequency and the minimum current at high frequency. This is accomplished by combining a variable impedance termination with a shunt resistance to ground. At low frequencies, a low impedance termination results in most of the current flowing to the termination, while at high frequencies, a high impedance means very little of the current flows to the termination. Typically, this impedance effect is achieved by a filter circuit in the transducer head, along with additional compensation for transmission line effects from the transducer head to the termination.

Figure 10:
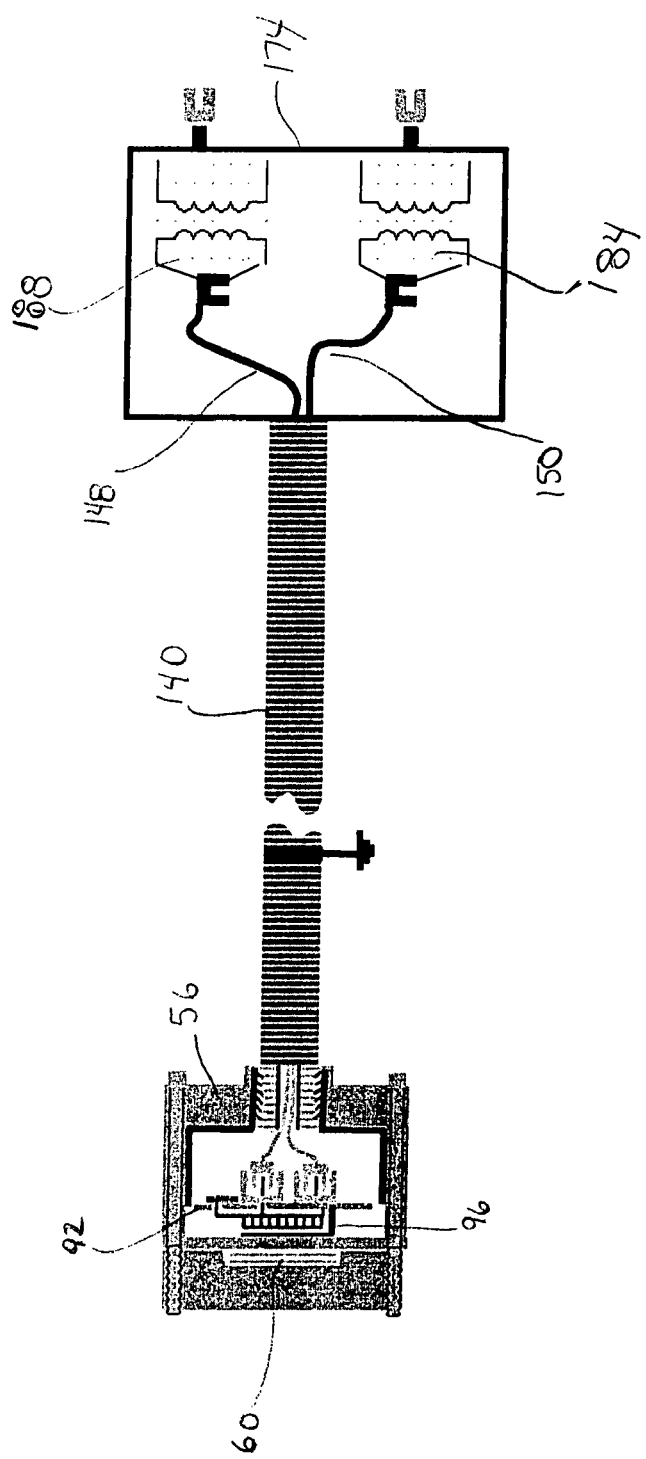
FIG. 10 depicts a varying impedance termination design, as attached to the sensor head of FIG. 9.

Here the approach is to exploit transmission line effects in order to achieve the desired impedance profile, as illustrated in FIG. 10. By connecting the impedance termination 174 to the sensor head 56 with a triaxial cable 140, similar to that shown in FIG. 9, whose electrical length is ¼ wavelength at the maximum operating frequency of the RF sensor, the desired impedance variation is achieved. At low frequency, the electrical length of the cable 168 is effectively zero, and the impedance seen by the pickups is the impedance of the termination. However, at maximum frequency, transmission line effects invert the impedance seen by the pickups. For the voltage pickup 96, the high impedance termination acts as a low impedance termination at high frequency, while the low impedance termination for current acts as a high impedance termination at high frequency.

Transformers allow the desired termination impedance to be achieved while maintaining a matched termination at the RF connectors. A low to high impedance transformer 184 is used for the voltage signal, while a high to low transformer 188 is used for the current signal. The use of transformers in RF and microwave circuitry is well established. However, these known uses are universally targeted to matching the load, whereas in this case the goal is to intentionally mismatch the load.

PARTS LIST FOR FIGS. 1-10

10 RF sensor
14 sensor case
18 center conductor
22 dielectric material
26 capacitive (voltage) pickup
30 current pickup
34 bulkhead connection
38 filter circuits
42 plot
46 plot
50 sensor assembly
56 enclosure
57 opening
60 conductor
66 capacitive pickup
68 electric field lines
70 current direction
74 magnetic flux lines
78 current pickup
80 current pickup
84 metal layer
88 metal layer
92 circuit board
96 capacitive pickup
100 skin shield layer
108 RF connectors
110 strain relief and shield
112 top shield
120 shielding vias
130 balanced top shield
134 metallization
138 metallization
140 cable, triaxial
142 outer jacket
144 outer braid
148 coaxial cable
150 coaxial cable
152 coaxial conductor
156 dielectric material layer
174 impedance termination
184 transformer
188 transformer While the present invention has been particularly shown and described with reference to the preferred mode as illustrated in the drawings, it will be understood by one skilled in the art that various changes in detail may be effected therein without departing from the spirit and scope of the invention.

We claim:

1. A miniature RF sensor assembly for measuring the RF current and voltage supplied to a plasma processing chamber of a microelectronics processing tool by a high power RF power supply, said assembly comprising:
a sensor head, said sensor head being defined by a multi-sided enclosure;
a conductor, said conductor being formed by a strap conductor of a plasma processing tool, said conductor further forming a side of said enclosure;
a voltage pickup; and
a current pickup, and
each of said voltage pickup and said current pickup being disposed within said sensor head, each of said voltage pickup and said current pickups are being stacked upon one another within said sensor head in relation to said conductor, said conductor being part of said plasma processing tool to which said sensor head is mounted.

2. A sensor assembly as recited in claim 1, wherein at least one of said current pickup and said voltage pickup are disposed within a printed circuit board.

3. A sensor assembly as recited in claim 2, wherein each of said voltage pickup and said current pickup are disposed in said printed circuit board.

4. A sensor assembly as recited in claim 2, wherein current pickup is an inductor that is formed from two layers of said printed circuit board, said layers being joined by blind vias.

5. A sensor assembly as recited in claim 1, wherein said circuit board is disposed within said multi-sided enclosure, said circuit board including a plurality of shielding vias disposed about the outer periphery thereof.

6. A sensor assembly as recited in claim 5, wherein said printed circuit board includes means for flattening the response of said conductor with frequency in order to produce constant gain.

7. A sensor assembly as recited in claim 6, wherein said response flattening means includes a skin effect shield layer disposed in proximity to said conductor, said layer being responsive to act as a low pass filter.

8. A sensor assembly as recited in claim 2, wherein said voltage pickup comprises a metal layer of said printed circuit board having a grid or mesh structure that is oriented parallel to the direction of the lines of magnetic flux from said conductor.

9. A sensor assembly as recited in claim 2, wherein said printed circuit board includes a shield to block any field coupling to connectors and cables connected to said sensor head.

10. A sensor assembly as recited in claim 9, wherein said printed circuit board includes a metal top layer that is grounded.

11. A sensor assembly as recited in claim 2, including a triaxial cable connected to said sensor head, said cable housing two coaxial cables carrying voltage and current signals from said sensor.

12. A sensor assembly as recited in claim 11, wherein said triaxial cable includes an outer coaxial conductor and a dielectric layer which is disposed over said outer coaxial conductor.

13. A sensor assembly as recited in claim 12, including an impedance termination wherein said impedance termination is connected to said sensor head with a triaxial cable whose electrical length is ¼ wavelength at the maximum operating frequency of the RF sensor.

14. A sensor assembly as recited in claim 13, wherein said impedance termination includes a pair of transformers, each of said transformers being used for a voltage and current pickup signal from said sensor head, said transformers being used to mismatch the load of each said signal to provide isolation.

15. A sensor assembly as recited in claim 14, wherein said pair of transformers includes a low to high impedance transformer for said voltage signal and a high to low impedance transformer for said current signal.

16. A sensor assembly as recited in claim 11, wherein said sensor head includes an opening for receiving said cable and a strain relief attached to said circuit board.

17. A sensor assembly as recited in claim 16, wherein said strain relief includes an electrical shield.

18. A sensor assembly comprising:
a sensor head including a multi-side dielectric enclosure;
a conductor arranged as one side of said sensor head, said conductor being a conductor strap of a plasma processing tool;
a current pickup;
a voltage pickup, each of said current pickup and said voltage pickups being arranged within a printed circuit board, and in which said voltage pickup and said current pickup are arranged above one another and above said conductor.

19. A sensor assembly as recited in claim 18, wherein said current pickup is defined by a pair of parallel layers of said board that are connected by blind vias forming an inductor.

20. A sensor assembly as recited in claim 19, wherein said voltage pickup is a metal layer formed from a mesh or grid structure oriented in a direction that is parallel to an EM field generated by said conductor.

21. A miniature RF sensor assembly for measuring the RF current and voltage supplied to a plasma processing chamber of a microelectronics processing tool by a high power RF power supply, said assembly comprising:
a sensor head, said sensor head being defined by a multi-sided enclosure;
a conductor, said conductor being formed by a strap conductor of a plasma processing tool, said conductor further forming a side of said enclosure;
a voltage pickup; and
a current pickup, and
each of said voltage pickup and said current pickup being disposed within said sensor head, each of said voltage pickup and said current pickups are being stacked upon one another within said sensor head and each of said current pickup and said voltage pickup being stacked above said conductor, said conductor being part of said plasma processing tool to which said sensor head is mounted.

* * * * *